US012113261B2

United States Patent
Guo et al.

(10) Patent No.: US 12,113,261 B2
(45) Date of Patent: Oct. 8, 2024

(54) PHASE SHIFTER AND ANTENNA

(71) Applicants: Beijing BOE Technology Development Co., Ltd., Beijing (CN); BOE TECHNOLOGY GROUP CO., LTD., Beijing (CN)

(72) Inventors: Jingwen Guo, Beijing (CN); Feng Qu, Beijing (CN)

(73) Assignees: Beijing BOE Technology Development Co., Ltd., Beijing (CN); BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 17/777,655

(22) PCT Filed: May 26, 2021

(86) PCT No.: PCT/CN2021/096034
§ 371 (c)(1),
(2) Date: May 18, 2022

(87) PCT Pub. No.: WO2022/246686
PCT Pub. Date: Dec. 1, 2022

(65) Prior Publication Data
US 2024/0213639 A1 Jun. 27, 2024

(51) Int. Cl.
*H01P 1/18* (2006.01)
*H01Q 3/36* (2006.01)
*H01Q 1/38* (2006.01)

(52) U.S. Cl.
CPC .............. *H01P 1/18* (2013.01); *H01P 1/184* (2013.01); *H01Q 3/36* (2013.01); *H01Q 1/38* (2013.01)

(58) Field of Classification Search
CPC .......... H01P 1/184; H01P 1/182; H01P 1/181; H01P 1/18; H01P 1/19; H01Q 3/38;
(Continued)

(56) References Cited

U.S. PATENT DOCUMENTS

| 6,373,007 | B1 | 4/2002 | Calcatera et al. |
| 2010/0289717 | A1* | 11/2010 | Arslan .................. H01Q 23/00 343/876 |
| 2021/0013569 | A1 | 1/2021 | Rahiminejad et al. |

FOREIGN PATENT DOCUMENTS

| CN | 101159345 A | 4/2008 |
| CN | 101212076 A | 7/2008 |

(Continued)

OTHER PUBLICATIONS

Yang et al., "Research status and development trend of micromechanical resonance accelerometer," High Power Laser & Particle Beams, Aug. 2017, vol. 29, No. 8. Eng. translation pp. 8-9.

(Continued)

*Primary Examiner* — Stephen E. Jones
(74) *Attorney, Agent, or Firm* — HOUTTEMAN LAW LLC

(57) ABSTRACT

A phase shifter includes a base substrate; a signal electrode, first and second reference electrodes all on the base substrate, and the first and second reference electrodes being respectively on two sides of a length direction of the signal electrode; an interlayer insulating layer on a side of the signal electrode away from the base substrate; and a phase control unit including a film bridge on a side of the interlayer insulating layer away from the base substrate. The signal electrode is in space enclosed by the base substrate and the film bridge, and two ends of the film bridge respectively overlap with the first and second reference electrodes in a direction perpendicular to the base substrate. The film bridge includes first and second anchor point areas and a functional area between the first and second anchor point areas, and has a hollow pattern in the functional area.

20 Claims, 7 Drawing Sheets

(58) Field of Classification Search
CPC .. H01Q 3/36; H01Q 3/30; H01Q 3/32; H01Q 3/34; B81B 7/02
See application file for complete search history.

(56) References Cited

FOREIGN PATENT DOCUMENTS

| CN | 101369679 A | 2/2009 |
| CN | 101572334 A | 11/2009 |
| CN | 205156925 U | 4/2016 |
| CN | 212322915 U | 1/2021 |

OTHER PUBLICATIONS

Huang et al., "Design and Implementation of a Micromechanical Silicon Resonant Accelerometer," Sensors, Nov. 19, 2013, vol. 13, pp. 15785-15804.

\* cited by examiner

PHASE SHIFTER AND ANTENNA

CROSS-REFERENCE TO RELATED APPLICATIONS

This is a National Phase application filed under 35 U.S.C. 371 as a national stage of PCT/CN2021/096034 filed on May 26, 2021, the content of which is incorporated herein by reference in its entirety.

TECHNICAL FIELD

The present disclosure relates to the field of communication technology, and particularly relates to a phase shifter and an antenna.

BACKGROUND

Phase shifters are devices capable of adjusting a phase of a wave. The phase shifters are widely applied in the fields of radar, missile attitude control, accelerators, communication, instruments, and the like. A conventional phase shifter is mainly implemented by using a ferrite material, and a switch such as a PIN diode or a field effect transistor. A ferrite phase shifter has a large power capacity and a small insertion loss, but has the disadvantages of complex process, expensive manufacturing cost, large volume and the like, which limit the large-scale application of the ferrite phase shifter. A semiconductor phase shifter has a small volume and a high operating speed, but has disadvantages of small power capacity, high power consumption and high difficulty in manufacturing. Compared with the conventional phase shifter, a micro-electromechanical system (MEMS) phase shifter has the advantages of small volume, light weight, short control time, small insertion loss, large loadable power and the like, and has great development and application prospects.

SUMMARY

Some embodiments of the present disclosure provide a phase shifter and an antenna.

In a first aspect, an embodiment of the present disclosure provides a phase shifter, including:
  a base substrate,
  a signal electrode, a first reference electrode, and a second reference electrode all on the base substrate, and the first reference electrode and the second reference electrode being respectively on two sides of a length direction of the signal electrode;
  an interlayer insulating layer on a side of the signal electrode away from the base substrate; and
  at least one phase control unit, each of which includes a film bridge on a side of the interlayer insulating layer away from the base substrate; the signal electrode being in space enclosed by at least part of the base substrate and the film bridge, and orthogonal projections of two ends of the film bridge on the base substrate respectively overlapping with orthogonal projections of the first reference electrode and the second reference electrode on the base substrate; wherein
  the film bridge includes a first anchor point area, a second anchor point area, and a functional area between the first anchor point area and the second anchor point area; and the film bridge has a hollow pattern in the functional area.

In an embodiment, the hollow pattern is axially symmetric with respect to an extending direction running through a perpendicular bisector of a width of the signal electrode.

In an embodiment, the film bridge includes a bridge deck structure, a first connection arm, and a second connection arm; the first connection arm is in the first anchor point area; the second connection arm is in the second anchor point area; the bridge deck structure includes a first functional part, a second functional part, a third functional part, a first connection part, and a second connection part; the first functional part and the second functional part are connected to each other by the first connection part; the first functional part and the third functional part are connected to each other by the second connection part; the second functional part is further connected with the first connection arm; the third function part is further connected with the second connection arm; an orthogonal projection of the first functional part on the base substrate is located within an orthogonal projection of the signal electrode on the base substrate; an orthogonal projection of the second functional part on the base substrate is located within an orthogonal projection of the first reference electrode on the base substrate; an orthogonal projection of the third functional part on the base substrate is located within an orthogonal projection of the second reference electrode on the base substrate; and the hollow pattern is at least in the first functional part.

In an embodiment, the hollow pattern at least includes a first groove and a second groove that are in the first functional part, and the first groove and the second groove are respectively on two sides of the first functional part in a length direction of the first functional part, and penetrate through the first functional part in a thickness direction of the first functional part; and
  each of the first connection part and the second connection part includes a first end and a second end opposite to each other; the second end of the first connection part is connected to a bottom of the first groove, and the second end of the second connection part is connected to a bottom of the second groove.

In an embodiment, the hollow pattern further includes a third groove and a fourth groove; the third groove is on a side of the second functional part proximal to the first functional part, and penetrates through the second functional part in a thickness direction of the second functional part; and the fourth groove is on a side of the third functional part proximal to the first functional part, and penetrates through the third functional part in a thickness direction of the third functional part; and
  the first end of the first connection part is connected to a bottom of the third groove, and the first end of the second connection part is connected to a bottom of the fourth groove.

In an embodiment, the film bridge includes a bridge deck structure, a first connection arm, and a second connection arm; the first connection arm is in the first anchor point area; the second connection arm is in the second anchor point area; the bridge deck structure includes a first functional part, a second functional part, a third functional part, a first connection part, and a second connection part; the first functional part and the second functional part are connected to each other by the first connection part; the first functional part and the third functional part are connected to each other by the second connection part; the second functional part is further connected with the first connection arm; the third function part is further connected with the second connection arm; an orthogonal projection of the first functional part on the base substrate is located within an orthogonal projection of the signal electrode on the base substrate; an orthogonal projection of the second functional part on the base substrate is located within an orthogonal projection of the first reference electrode on the base substrate; an orthogonal projection of the third functional part on the base substrate is located within an orthogonal projection of the second reference electrode on the base substrate; and the hollow pattern is at least in the first connection part and/or the second connection part.

In an embodiment, the hollow pattern includes a first hollow sub-pattern and a second hollow sub-pattern;

the first connection part includes a first meandering line and a second meandering line spaced apart from each other along the length direction of the signal electrode;

the second connection part includes a third meandering line and a fourth meandering line spaced apart from each other along the length direction of the signal electrode;

the first meandering line and the second meandering line are both connected between the first functional part and the second functional part, and define the first hollow sub-pattern; and the third meandering line and the fourth meandering line are both connected between the first functional part and the third functional part, and define the second hollow sub-pattern.

In an embodiment, the first meandering line and the second meandering line are in mirror symmetry with respect to an axis of symmetry perpendicular to the length direction of the signal electrode; and the third meandering line and the fourth meandering line are in mirror symmetry with respect to an axis of symmetry perpendicular to the length direction of the signal electrode.

In an embodiment, each of the first meandering line, the second meandering line, the third meandering line, and the fourth meandering line includes a first connection bar, a second connection bar, and a meandering part; each of the first connection bar, the second connection bar, and the meandering part includes a first end and a second end;

for each of the first meandering line, the second meandering line, the third meandering line, and the fourth meandering line, the second end of the first connection bar is connected to the first end of the meandering part, and the second end of the meandering part is connected to the first end of the second connection bar;

for each of the first meandering line and the second meandering line, the first end of the first connection bar is connected to the second functional part, and the second end of the second connection bar is connected to the first functional part;

for each of the third meandering line and the fourth meandering line, the first end of the first connection bar is connected to the third functional part, and the second end of the second connection bar is connected to the first functional part;

a connection line between the first end of the first connection bar of the first meandering line and the second end of the second connection bar of the first meandering line is a first line segment; a connection line between the first end of the first connection bar of the second meandering line and the second end of the second connection bar of the second meandering line is a second line segment; and orthogonal projections of the meandering parts of the first meandering line and the second meandering line on the base substrate are both located within an area defined by orthogonal projections of the first line segment and the second line segment on the base substrate; and/or, a connection line between the first end of the first connection bar of the third meandering line and the second end of the second connection bar of the third meandering line is a third line segment; a connection line between the first end of the first connection bar of the fourth meandering line and the second end of the second connection bar of the fourth meandering line is a fourth line segment; and orthogonal projections of the meandering parts of the third meandering line and the fourth meandering line on the base substrate are both located within an area defined by orthogonal projections of the third line segment and the fourth line segment on the base substrate.

In an embodiment, each of the first meandering line, the second meandering line, the third meandering line, and the fourth meandering line includes a first connection bar, a second connection bar, and a meandering part; each of the first connection bar, the second connection bar, and the meandering part includes a first end and a second end;

for each of the first meandering line, the second meandering line, the third meandering line, and the fourth meandering line, the second end of the first connection bar is connected to the first end of the meandering part, and the second end of the meandering part is connected to the first end of the second connection bar;

for each of the first meandering line and the second meandering line, the first end of the first connection bar is connected to the second functional part, and the second end of the second connection bar is connected to the first functional part;

for each of the third meandering line and the fourth meandering line, the first end of the first connection bar is connected to the third functional part, and the second end of the second connection bar is connected to the first functional part;

a connection line between the first end of the first connection bar of the first meandering line and the second end of the second connection bar of the first meandering line is a first line segment; a connection line between the first end of the first connection bar of the second meandering line and the second end of the second connection bar of the second meandering line is a second line segment; and orthogonal projections of the meandering parts of the first meandering line and the second meandering line on the base substrate are both located outside an area defined by orthogonal projections of the first line segment and the second line segment on the base substrate; and/or, a connection line between the first end of the first connection bar of the third meandering line and the second end of the second connection bar of the third meandering line is a third line segment; a connection line between the first end of the first connection bar of the fourth meandering line and the second end of the second connection bar of the fourth meandering line is a fourth line segment; and orthogonal projections of the meandering parts of the third meandering line and the fourth meandering line on the base substrate are both located outside an area defined by orthogonal projections of the third line segment and the fourth line segment on the base substrate.

In an embodiment, the first connection arm includes a first connection sub-arm and a second connection sub-arm; the second connection arm includes a third connection sub-arm and a fourth connection sub-arm; each of the second functional part and the third functional part includes a first end and a second end opposite to each other along the length direction of the signal electrode;

the first connection sub-arm is connected to the first end of the second functional part, and the second connection sub-arm is connected to the second end of the second functional part; and the third connection sub-arm is connected to the first end of the third functional part, and the fourth connection sub-arm is connected to the second end of the third functional part.

In an embodiment, length directions of the second functional part and the third functional part are the same as the length direction of the signal electrode.

In an embodiment, each of the second functional part and the third functional part includes a main body part, a first extension part and a second extension part; a length direction of the main body part is the same as the length direction of the signal electrode, the first extension part and the second extension part are respectively connected to two ends of the main body part opposite to each other in the length direction of the main body, and extend toward the signal electrode;

the first extension part of the second functional part is connected with the first connection sub-arm, and the second extension part of the second functional part is connected with the second connection sub-arm; and the first extension part of the third functional part is connected with the third connection sub-arm, and the second extension part of the third functional part is connected with the fourth connection sub-arm.

In an embodiment, the hollow pattern includes a first hollow sub-pattern and a second hollow sub-pattern;

the first hollow sub-pattern penetrates through at least parts of structures of the second functional part and the first connection part in a direction perpendicular to the length direction of the signal electrode; and the second hollow sub-pattern penetrates through at least parts of structures of the third functional part and the second connection part in the direction perpendicular to the length direction of the signal electrode.

In an embodiment, the phase shifter further includes a mass loading structure on a side of the first functional part away from the signal electrode.

In an embodiment, the phase shifter further includes a first switch unit on the base substrate, and the first switch unit is configured to provide a bias voltage signal to the film bridge upon receipt of a first control signal.

In an embodiment, the first switch unit includes a first switch transistor, a first electrode of the first switch transistor serves as a bias voltage input terminal of the first switch unit, a second electrode of the first switch transistor serves as a first output terminal of the first switch unit, a control electrode of the first switch transistor serves as a first control terminal of the first switch unit, and the first switch transistor is capable of electrically connecting the first electrode and the second electrode to each other upon receipt of the first control signal at the control electrode.

In an embodiment, the phase shifter further includes a second switch unit on the base substrate, and the second switch unit is configured to electrically connect the signal electrode and the film bridge to each other upon receipt of a second control signal.

In an embodiment, the first switch unit is further configured to electrically connect the signal electrode and the film bridge to each other upon receipt of the second control signal.

In an embodiment, at least some of the at least one phase control unit have different numbers of film bridges.

In a second aspect, an embodiment of the present disclosure provides an antenna, including the phase shifter as described above.

DETAIL DESCRIPTION OF EMBODIMENTS

To enable one of ordinary skill in the art to better understand technical solutions of the present disclosure, the present disclosure will be further described in detail below with reference to the accompanying drawings and specific embodiments.

Unless defined otherwise, technical or scientific terms used herein should have the same meaning as commonly understood by one of ordinary skill in the art to which the present disclosure belongs. The terms of "first", "second", and the like used herein are not intended to indicate any order, quantity, or importance, but rather are used for distinguishing one element from another. Further, the terms "a", "an", "the", and the like used herein do not denote a limitation of quantity, but rather denote the presence of at least one element. The term of "comprising", "including", or the like, means that the element or item preceding the term contains the element or item listed after the term and its equivalent, but does not exclude the presence of other elements or items. The term "connected" or "coupled" is not limited to physical or mechanical connection, but may include electrical connection, whether direct or indirect connection. The terms "upper", "lower", "left", "right", and the like are used only to indicate relative positional relationships, and when the absolute position of an object being described is changed, the relative positional relationships may also be changed accordingly.

Figure 1:
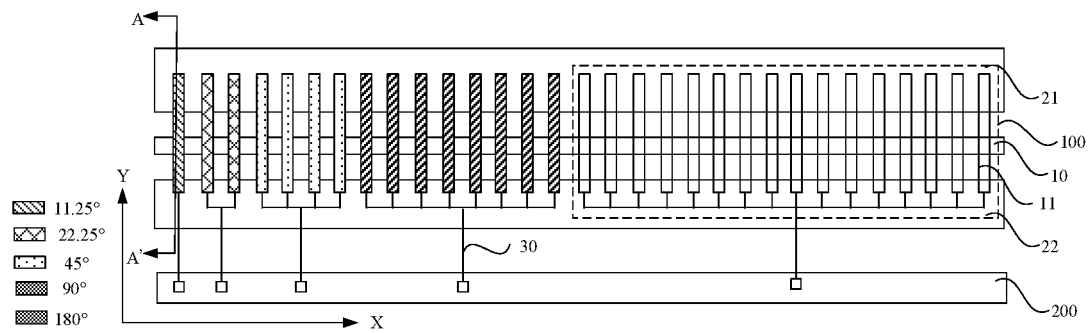
FIG. 1 shows a structure of an exemplary phase shifter.
Figure 2:
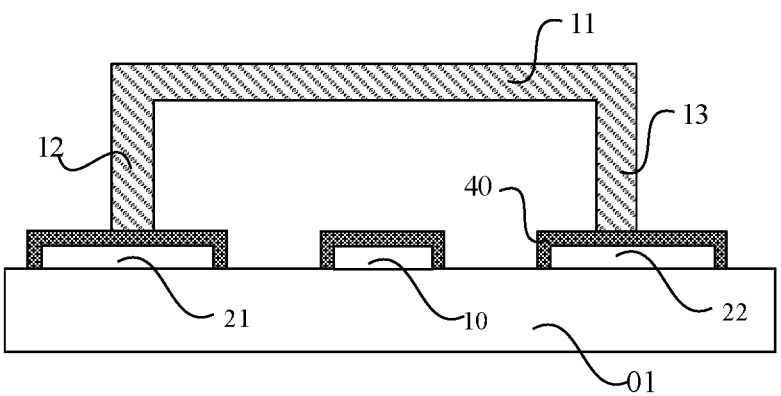
FIG. 2 is a cross-sectional view of the phase shifter in FIG. 1 taken along a line A-A'.

FIG. 1 shows a structure of an exemplary phase shifter; FIG. 2 is a cross-sectional view of the phase shifter in FIG. 1 taken along a line A-A'. As shown in FIGS. 1 and 2, the phase shifter includes a base substrate 01, a first reference electrode, a second reference electrode, a signal electrode 10, an interlayer insulating layer 40, a plurality of phase control units 100, a control unit 200, and direct current (DC) bias lines 30.

Specifically, the signal electrode 10 is arranged on the base substrate 01 and extends along a first direction X. The first reference electrode and the second reference electrode are respectively arranged on both sides of the extending direction of the signal electrode 10, and extending directions of the first reference electrode and the second reference electrode may be the same as or intersect with the extending direction of the signal electrode 10. To achieve a small size of the phase shifter, it is preferable that the extending directions of the first reference electrode and the second reference electrode are set to be the same as the extending direction of the signal electrode 10. In the embodiments of the present disclosure, descriptions are given by taking only a case where the first reference electrode, the second reference electrode, and the signal electrode 10 are all extended along the first direction X as an example. The signal electrode 10, the first reference electrode and the second reference electrode may be disposed in the same layer and made of the same material. The first reference electrode and the second reference electrode include but are not limited to ground electrodes. In the embodiments of the present disclosure, descriptions are given by taking a case where the first reference electrode and the second reference electrode are ground electrodes as an example. For convenience of description, the first reference electrode is represented by a first ground electrode 21, and the second reference electrode is represented by a second ground electrode 22. The interlayer insulating layer 40 is disposed on a side of the layer where the signal electrode 10, the first ground electrode 21, and the second ground electrode 22 are located away from (i.e., distal to) the base substrate 01, and the interlayer insulating layer 40 covers at least the signal electrode 10, the first ground electrode 21, and the second ground electrode 22.

The plurality of phase control units 100 are disposed on a side of the interlayer insulating layer 40 away from the base substrate 01. Each phase control unit 100 includes at least one film bridge; each film bridge bridges (i.e., bridge connects) between the first ground electrode 21 and the second ground electrode 22. Specifically, each film bridge is of an arched structure, and includes a bridge deck structure 11, and a first connection arm 12 and a second connection arm 13 respectively connected to both ends of the bridge deck structure. The first connection arm 12 is located on a part of the interlayer insulating layer above the first reference electrode, the second connection arm 13 is located on another part of the interlayer insulating layer 40 above the second reference electrode, and the bridge deck structure extends along a second direction Y. The second direction Y intersects with the first direction X, for example, the first direction X and the second direction Y are perpendicular to each other. The signal electrode 10 is located in space formed between the bridge deck structure and the base substrate 01. Each film bridge is electrically connected to a corresponding DC bias line, and the DC bias line(s) connected to the at least one film bridge in each phase control unit 100 are connected together and connected to the control unit 200. When the control unit 200 does not control the bias current line(s) to apply bias voltage(s) to the at least one film bridge, each film bridge is suspended above the signal electrode 10 and does not contact a part of the interlayer insulating layer 40 above the signal electrode 10. The bridge deck structure of the film bridge has a certain elasticity, and when the control unit 200 inputs a DC bias voltage to the film bridge, the bridge deck structure of the film bridge can be driven to move in a direction perpendicular to the signal electrode 10, that is, by applying a DC bias voltage to the film bridge, a distance between the bridge deck structure of the film bridge and the signal electrode 10 can be changed, so that capacitance of a capacitor formed by the bridge deck structure of the film bridge and the signal electrode 10 can be changed. Since different phase control units 100 have different numbers of film bridges, distributed capacitances generated by the film bridges 11 and the signal electrode 10 after a DC bias voltage is applied have different magnitudes, and accordingly adjusted phase shift amounts are different. That is, each phase control unit 100 correspondingly adjusts one phase shift amount (film bridges with the same filling pattern in FIG. 1 are represented as belonging to a same phase control unit 100). Therefore, to perform adjustment of a phase shift amount, a corresponding phase adjustment unit (i.e., a corresponding phase control unit) is provided with a voltage according to the phase shift amount to be adjusted.

It should be noted that the first direction X refers to a length direction (i.e., a lengthwise direction) of the signal electrode 10, and the second direction Y refers to a width direction (i.e., a widthwise direction) of the signal electrode 10.

The inventors found that when applying a DC bias voltage to the film bridge, due to the width of the bridge deck structure 11 of the film bridge, the bridge deck structure cannot move towards the signal electrode 10 in parallel (i.e., the bridge deck structure cannot remain parallel to the signal electrode 10 during moving toward the signal electrode 10), resulting in problems of insufficient phase shift accuracy and poor controllability.

In view of the above technical problems, embodiments of the present disclosure provide the following technical solutions.

Figure 3:
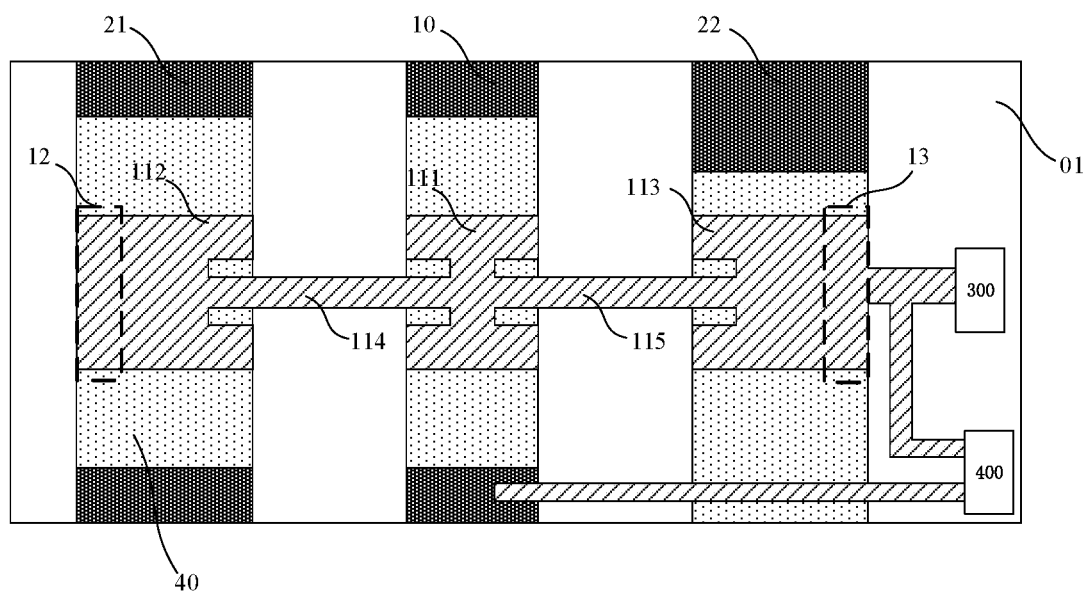
FIG. 3 is a top view of a phase shifter according to an embodiment of the present disclosure.
Figure 4:
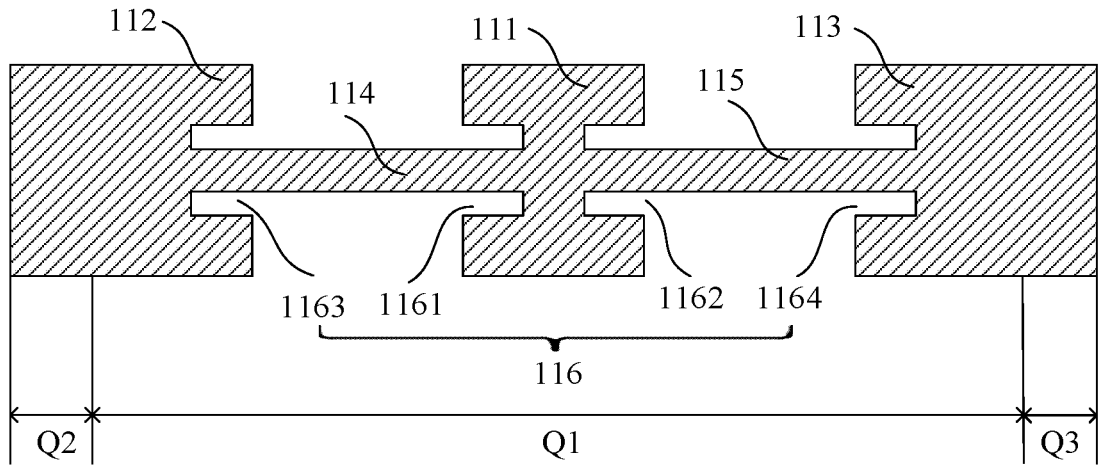
FIG. 4 is a top view of a film bridge of a phase shifter according to an embodiment of the present disclosure.

In a first aspect, FIG. 3 is a top view of a phase shifter according to an embodiment of the present disclosure; FIG. 4 is a top view of a film bridge of a phase shifter according to an embodiment of the present disclosure. As shown in FIGS. 3 and 4, an embodiment of the present disclosure provides a phase shifter including a base substrate 01, a signal electrode 10, a first ground electrode 21, a second ground electrode 22, an interlayer insulating layer 40, and at least one phase control unit. The signal electrode 10, the first ground electrode 21 and the second ground electrode 22 are all disposed on the base substrate 01, and the first ground electrode 21 and the second ground electrode 22 are respectively disposed on both sides of the length direction of the signal electrode 10. The interlayer insulating layer 40 is disposed on a side of a layer where the signal electrode 10 is located away from the base substrate 01. Each phase control unit includes film bridge(s) disposed on the interlayer insulating layer 40 away from the base substrate 01. The signal electrode 10 is located in space formed by the base substrate 01 and the film bridge(s), and orthogonal projections of two ends of each film bridge on the base substrate 01 overlap with orthogonal projections of the first ground electrode 21 and the second ground electrode 22 on the base substrate 01, respectively. Each film bridge in the embodiment of the present disclosure is divided into a first anchor point area Q2, a second anchor point area Q3, and a functional area Q1 between the first anchor point area Q2 and the second anchor point area Q3; and each film bridge has a hollow pattern 116 in the functional area Q1.

It should be noted that the first anchor point area Q2 in the embodiment of the present disclosure refers to an area where the orthogonal projections of the film bridge and the first ground electrode 21 on the base substrate overlap with each other; the second anchor point area Q3 refers to an area where the orthogonal projections of the film bridge and the second ground electrode 22 on the base substrate overlap with each other.

In the phase shifter of the embodiment of the present disclosure, the film bridge is provided with the hollow pattern 116 in the functional area Q1, which is equivalent to reducing the width of a part of the film bridge in the functional area Q1. Therefore, when a DC bias voltage is applied to the film bridge, the functional area Q1 of the film bridge can move down towards the signal electrode 10 as parallelly as possible, thereby ensuring the phase shift accuracy of the phase shifter.

In some exemplary embodiments, the hollow pattern 116 in the functional area Q1 of the film bridge is axially symmetric with respect to the extending direction running through a perpendicular bisector of the width of the signal electrode 10, and thus is an axisymmetric pattern. This is because, generally, a distance between the signal electrode 10 and the first ground electrode 21 is equal to a distance between the signal electrode 10 and the second ground electrode 22, and a distance between an overlapping area of the orthogonal projections of the film bridge and the first ground electrode 21 on the base substrate 01 and the orthogonal projection of the signal electrode 10 on the base substrate 01 is equal to a distance between an overlapping area of the orthogonal projections of the film bridge and the second ground electrode 22 on the base substrate 01 and the orthogonal projection of the signal electrode 10 on the base substrate 01. In this case, the hollow pattern 116 in the functional area Q1 of the film bridge takes the extending direction running through the perpendicular bisector of the width of the signal electrode 10 as the axis of symmetry, and is an axisymmetric pattern, which can ensure that electrostatic forces received at every positions of the film bridge are equal or substantially equal to each other when the film bridge is applied with a DC bias voltage, so that the functional area Q1 of the film bridge can move down towards the signal electrode 10 as parallelly as possible, thereby ensuring the phase shift accuracy of the phase shifter.

In order to make the structure of the phase shifter according to the embodiments of the present disclosure clearer, a specific description is given with reference to the accompanying drawings. In addition, since the structures of the signal electrode 10, the first ground electrode 21 and the second ground electrode 22 are substantially the same as those in the phase shifter shown in FIG. 1, the film bridge in the phase shifter is mainly described in detail below.

In a first exemplary embodiment, as shown in FIGS. 3 and 4, the film bridge in the phase shifter includes a bridge deck structure 11, a first connection arm 12 and a second connection arm 13. The first connection arm 12 is located in the first anchor point area Q2; the second connection arm 13 is located in the second anchor point area Q3. The bridge deck structure 11 includes a first functional part 111, a second functional part 112, a third functional part 113, a first connection part 114 and a second connection part 115. The first functional part 111 and the second functional part 112 are connected through the first connection part 114; the first functional part 111 and the third functional part 113 are connected through the second connection part 115. The second functional part 112 is also connected to the first connection arm 12; the third functional part 113 is also connected to the second connection arm 13. An orthogonal projection of the first functional part 111 on the base substrate 01 overlaps with (e.g., is located within) the orthogonal projection of the signal electrode 10 on the base substrate 01. An orthogonal projection of the second functional part 112 on the base substrate 01 overlaps with (e.g., is located within) the orthogonal projection of the first reference electrode on the base substrate 01. An orthogonal projection of the third functional part 113 on the base substrate 01 overlaps with (e.g., is located within) the orthogonal projection of the second reference electrode on the base substrate 01. The hollow pattern 116 is located at least on the first functional part 111.

It should be noted that, referring to FIG. 4, the first connection part 114 and the second connection part 115 have the same structure, both adopt a strip-shaped structure, and have the same size. However, in an actual product, the first connection part 114 and the second connection part 115 may adopt different structures, and the first connection part 114 and the second connection part 115 shown in FIG. 4 are only taken as an example. In addition, a width of each of the first connection part 114 and the second connection part 115 in the length direction of the signal electrode 10 is smaller than a width of the first functional part 111 in the length direction of the signal electrode 10. It should also be noted that in the embodiment of the present disclosure, a case where the width of the first functional part 111 in the length direction of the signal electrode 10 is greater than a length of the first functional part 111 in the width direction of the signal electrode 10 is taken as an example, that is, the width of the first functional part 111 in the length direction of the signal electrode 10 is the length of the first functional part 111, and the length of the first functional part 111 in the width direction of the signal electrode 10 is the width of the first functional part 111. Meanwhile, length directions and width directions of the second functional part 112 and the third functional part 113 are the same as the length direction and the width direction of the first functional part 111, respectively.

Since the first functional part 111 is provided with the hollow pattern 116, it is equivalent to reducing the width of the part of the film bridge in the functional area Q1. Therefore, when a DC bias voltage is applied to the film bridge, the functional area Q1 of the film bridge can move down towards the signal electrode 10 as parallelly as possible, thereby ensuring the phase shift accuracy of the phase shifter.

In some exemplary embodiments, with continued reference to FIG. 4, the hollow pattern 116 of the film bridge of the phase shifter includes a first groove 1161 and a second groove 1162. The first groove 1161 and the second groove 1162 are respectively disposed on both sides of the first functional part 111 in the length direction of the first functional part 111, and penetrate through the first functional part 111 in a thickness direction of the first functional part 111. Each of the first connection part 114 and the second connection part 115 includes a first end and a second end opposite to each other; the second end of the first connection part 114 is connected to a bottom of the first groove 1161, and the second end of the second connection part 115 is connected to a bottom of the second groove 1162. That is, openings of the first groove 1161 and the second groove 1162 are disposed back to back (i.e., distal to each other). For example, the first groove 1161 and the second groove 1162 are arranged in mirror symmetry with respect to the length direction of the signal electrode 10. With this configuration, it can be ensured that the electrostatic forces received at every positions of the film bridge are equal or substantially equal to each other when the film bridge is applied with a DC bias voltage, so that the bridge deck structure 11 can move down towards the signal electrode 10 as parallelly as possible, thereby ensuring the phase shift accuracy of the phase shifter.

Further, with continued reference to FIG. 4, the hollow pattern 116 of the bridge deck structure 11 not only includes the first groove 1161 and the second groove 1162, but also includes a third groove 1163 and a fourth groove 1164. The third groove 1163 is located on a side of the second functional part 112 proximal to the first functional part 111 and penetrates through the second functional part 112 in a thickness direction of the second functional part 112. The fourth groove 1164 is located on a side of the third functional part 113 proximal to the first functional part 111 and penetrates through the third functional part 113 in the thickness direction of the third functional part 113. The first end of the first connection part 114 is connected to a bottom of the third groove 1163, and the first end of the second connection part 115 is connected to a bottom of the fourth groove 1164. That is, the first connection part 114 is connected between the first groove 1161 and the third groove 1163; the second connection part 115 is connected between the second groove 1162 and the fourth groove 1164. In some exemplary embodiments, the first groove 1161, the second groove 1162, the third groove 1163 and the fourth groove 1164 are the same in shape and in size. Moreover, as shown in FIG. 4, the widths of the first connection part 114 and the second connection part 115 in the length direction of the signal electrode 10 are both smaller than a width of the first groove 1161 in the length direction of the signal electrode 10. In this case, the first groove 1161 and the second groove 1162 are provided in the first functional part 111, the third groove 1163 is provided in the second functional part 112, and the fourth groove 1164 is provided in the third functional part 113, such that the overall bridge deck width of the functional area Q1 of the bridge deck structure 11 is reduced. In addition, the first connection part 114 is connected between the first groove 1161 and the third groove 1163, and the second connection part 115 is connected between the second groove 1162 and the fourth groove 1164, which can ensure that the electrostatic force received at every position of the bridge deck structure 11 is constant or substantially constant when the film bridge is applied with a DC bias voltage, so that the bridge deck structure 11 can move down towards the signal electrode 10 in parallel, thereby ensuring the phase shift accuracy of the phase shifter.

In some exemplary embodiments, the bridge deck structure 11, the first connection arm 12 and the second connection arm 13 of the film bridge are formed as a single piece. In this case, the bridge deck structure 11, the first connection arm 12 and the second connection arm 13 may be formed by one patterning process, that is, may include the same material, for example, the bridge deck structure 11, the first connection arm 13 12 and the second connection arm 13 are all made of a metal material. Alternatively, materials of the bridge deck structure 11, the first connection arm 12 and the second connection arm 13 may be different, for example, the bridge deck structure 11 is made of a metal material, and the first connection arm 12 and the second connection arm 13 are both made of an insulating material.

In some exemplary embodiments, with continued reference to FIG. 3, in order to further improve the phase adjustment capability of the phase shifter, the phase shifter further includes a first switch unit 300 disposed on the base substrate 01, and the first switch unit 300 is configured to provide a bias voltage signal to the film bridge upon receipt of a first control signal. Because the phase shifter provided in the embodiments of the present disclosure further includes the first switch unit 300 disposed on the base substrate 01, and the first switch unit 300 can perform individual potential control on the film bridges of the phase shifter where the first switch unit is located under the control of the first control signal. As such, when a plurality of phase shifters provided in the embodiments of the present disclosure are used as a plurality of phase shift units to form a complex control circuit (such as an array antenna), the first control signals may be sent to the respective first switch units 300 to independently regulate and control operating states of different phase shift units, accurately regulate and control the phase shift degree, and realize circuit level control of unit devices.

A circuit structure of the first switch unit 300 is not particularly limited in the embodiments of the present disclosure, for example, as an example of the embodiment of the present disclosure, the first switch unit 300 has a bias voltage input terminal, a first output terminal, and a first control terminal. The bias voltage input terminal is configured to receive a DC bias voltage signal, the first output terminal is electrically connected to the film bridge through a DC bias line, and the first switch unit 300 is able to electrically connect the first output terminal and the bias voltage input terminal together when the first control terminal receives the first control signal. To simplify a process, preferably, the DC bias line and the film bridge are arranged in the same layer, i.e., formed in the same patterning process.

In some exemplary embodiments, the circuit structure of the first switch unit 300 may be implemented by a thin film transistor (TFT), for example, the first switch unit 300 includes a first switch transistor, a first electrode of the first switch transistor serves as the DC bias voltage input terminal of the first switch unit 300, a second electrode of the first switch transistor serves as the first output terminal of the first switch unit 300 (i.e., the second electrode of the first switch transistor is electrically connected to the film bridge through the DC bias line), a control electrode of the first switch transistor serves as the first control terminal of the first switch unit 300, and the first switch transistor is capable of enabling electric connection between the first electrode and the second electrode when the control electrode receives the first control signal.

The inventors also found in the research that the existing phase shifter often has a hysteresis effect caused by residual charges in frequent charging and discharging processes, which results in the problem of reduced precision caused by different initial capacitance values of the phase shift units during an operating process.

In order to solve the above technical problem and improve the control accuracy of the phase shifter, as a preferable implementation of the embodiments of the present disclosure, as shown in FIG. 3, the phase shifter further includes, in addition to the above structures, a second switch unit 400 disposed on the base substrate 100, and the second switch unit 400 is configured to electrically connect the signal electrode to the film bridge upon receipt of a second control signal. Specifically, as shown in FIG. 3, the second switch unit 400 may be electrically connected to the signal electrode through a connection line, and is electrically connected to the film bridge through the DC bias line.

In the phase shifter according to the present embodiments of the present disclosure, the second switch unit 400 is capable of electrically connecting the signal electrode and the film bridge upon receipt of the second control signal, thereby forming a residual charge discharging loop between the signal electrode and the film bridge. Therefore, the hysteresis effect caused by residual charges in the frequent charging and discharging processes of the phase shift unit is avoided, and the uniformity of the initial capacitances of the phase shift units during operation processes is improved, thereby improving the control precision of the phase shifter on the phase of a radio frequency signal.

In order to improve process compatibility of the phase shifter, as a preferable implementation of the embodiments of the present disclosure, as shown in FIG. 3, the first switch unit 300 may not only have the above functions, but may also be directly configured to electrically connect the signal electrode to the film bridge upon receipt of the second control signal.

In some exemplary embodiments, the circuit structure of the first switch unit 300 may be a MEMS single-pole double-throw switch. With the single-pole double-throw switch, an operating loop is selected to switch the operating state of the phase shifter, and selection is performed between an external driving circuit and the residual charge discharging circuit.

Figure 5:
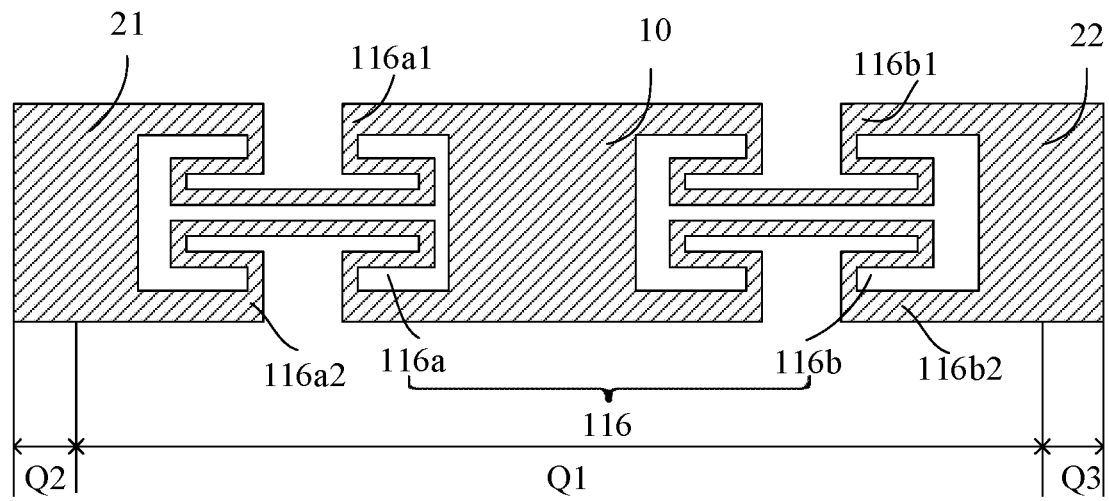
FIG. 5 is a top view of a film bridge of another phase shifter according to an embodiment of the present disclosure.

As a second exemplary embodiment, FIG. 5 is a top view of a film bridge of another phase shifter according to an embodiment of the present disclosure. As shown in FIG. 5, a structure of the phase shifter is roughly the same as the structure of the phase shifter in the first exemplary embodiment shown in FIG. 3, differs only in the film bridge, and the film bridge of the phase shifter shown in FIG. 5 will be described in detail below. The film bridge includes a bridge deck structure 11, a first connection arm 12 and a second connection arm 13. The first connection arm 12 is located in a first anchor point area Q2; the second connection arm 13 is located in a second anchor point area Q3. The bridge deck structure 11 includes a first functional part 111, a second functional part 112, a third functional part 113, a first connection part 114 and a second connection part 115. The first functional part 111 and the second functional part 112 are connected to each other by the first connection part 114; the first functional part 111 and the third functional part 113 are connected to each other by the second connection part 115. The second functional part 112 is also connected with the first connection arm 12; the third functional part 113 is also connected with the second connection arm 13. An orthogonal projection of the first functional part 111 on the base substrate 01 overlaps with (e.g., is located within) the orthogonal projection of the signal electrode 10 on the base substrate 01; an orthogonal projection of the second functional part 112 on the base substrate 01 overlaps with (e.g., is located within) the orthogonal projection of the first reference electrode on the base substrate 01; an orthogonal projection of the third functional part 113 on the base substrate 01 overlaps with (e.g., is located within) the orthogonal projection of the second reference electrode on the base substrate 01. The hollow pattern 116 is provided at least on the first connection part 114 and/or the second connection part 115. It should be noted that, a case where the hollow pattern 116 is provided on the first connection part 114 and the second connection part 115 shown in FIG. 5 is taken as an example for illustration, but this does not constitute a limitation on the protection scope of the embodiments of the present disclosure. In the following description, the case where the hollow pattern 116 is provided on the first connection part 114 and the second connection part 115 is taken as an example for illustration.

Since the hollow pattern 116 is formed on the first connection part 114 and the second connection part 115, the overall width of the bridge deck structure 11 can be reduced, thereby ensuring that the electrostatic force received at every position of the bridge deck structure 11 is constant or substantially constant when the film bridge is applied with a DC bias voltage, so that the bridge deck structure 11 can move in parallel down towards the signal electrode 10, thereby ensuring the phase shift accuracy of the phase shifter.

Figure 6:
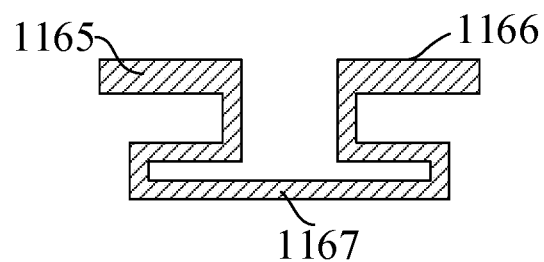
FIG. 6 is a schematic diagram of a first meandering line (i.e., a serpentine line) according to an embodiment of the present disclosure.

In some exemplary embodiments, FIG. 6 is a schematic diagram of a first meandering line 116a1 according to an embodiment of the present disclosure. As shown in FIGS. 5 and 6, the hollow pattern 116 includes a first hollow sub-pattern 116a and a second hollow sub-pattern 116b. The first connection part 114 includes a first meandering line 116a1 and a second meandering line 116a2 spaced apart from each other (i.e., disposed with an interval therebetween) along the length direction of the signal electrode 10; the second connection part 115 includes a third meandering line 116b1 and a fourth meandering line 116b2 spaced apart from each other along the length direction of the signal electrode 10. The first meandering line 116a1 and the second meandering line 116a2 are both connected between the first functional part 111 and the second functional part 112, and define the first hollow sub-pattern 116a. The third meandering line 116b1 and the fourth meandering line 116b2 are both connected between the first functional part 111 and the third functional part 113, and define the second hollow sub-pattern 116b. In this case, the overall bridge deck width of the bridge deck structure 11 can be effectively reduced, which ensures that the electrostatic force received at every position of the bridge deck structure 11 is constant or substantially constant when the film bridge is applied with a DC bias voltage, so that the bridge deck structure 11 can move down towards the signal electrode 10 in parallel, thereby ensuring the phase shift accuracy of the phase shifter. In addition, both the first connection part 114 and the second connection part 115 adopt a meandering line structure, which can also ensure flexibility of the bridge deck structure 11 during a pull-down process, thereby ensuring stability of the bridge deck structure 11.

In some exemplary embodiments, with continued reference to FIG. 5, the first meandering line 116a1 and the second meandering line 116a2 are arranged in mirror symmetry with respect to an axis of symmetry perpendicular to the length direction of the signal electrode 10 (i.e., an axis of symmetry along the width direction of the signal electrode 10). The third meandering line 116b1 and the fourth meandering line 116b2 are arranged in mirror symmetry with respect to the axis of symmetry perpendicular to the length direction of the signal electrode 10. In this case, when a DC bias voltage is applied to the film bridge, the first connection part 114 and the second connection part 115 of the film bridge structure can be subjected to uniform force under the action of electrostatic force, thereby ensuring phase shifting accuracy.

In some exemplary embodiments, with continued reference to FIG. 5, each of the first meandering line 116a1, the second meandering line 116a2, the third meandering line 116b1, and the fourth meandering line 116b2 includes a first connection bar 1165, a second connection bar 1166 and a meandering part 1167. Each of the first connection bar 1165, the second connection bar 1166, and the meandering part 1167 includes a first end and a second end. Specifically, for the first meandering line 116a1, the first end of the first connection bar 1165 is connected to the second functional part 112, the second end of the first connection bar 1165 is connected to the first end of the meandering part 1167, the second end of the meandering part 1167 is connected to the first end of the second connection bar 1166, and the second end of the second connection bar 1166 is connected to the first functional part 111. For the second meandering line 116a2, the first end of the first connection bar 1165 is connected to the second functional part 112, the second end of the first connection bar 1165 is connected to the first end of the meandering part 1167, and the second end of the meandering part 1167 is connected to the first end of the second connection bar 1166, and the second end of the second connection bar 1166 is connected to the first functional part 111. For the third meandering line 116b1, the first end of the first connection bar 1165 is connected to the third functional part 113, the second end of the first connection bar 1165 is connected to the first end of the meandering part 1167, and the second end of the meandering part 1167 is connected to the first end of the second connection bar 1166, and the second end of the second connection bar 1166 is connected to the first functional part 111. For the fourth meandering line 116b2, the first end of the first connection bar 1165 is connected to the third functional part 113, the second end of the first connection bar 1165 is connected to the first end of the meandering part 1167, and the second end of the meandering part 1167 is connected to the first end of the second connection bar 1166, and the second end of the second connection bar 1166 is connected to the first functional part 111. As shown in FIG. 6, extending directions of both the first connection bar 1165 and the second connection bar 1166 in each of the first meandering line 116a1, the second meandering line 116a2, the third meandering line 116b1 and the fourth meandering line 116b2 intersect with the length direction of the signal electrode 10, for example, are perpendicular to the length direction of the signal electrode 10. The meandering part 1167 in each of the first meandering line 116a1, the second meandering line 116a2, the third meandering line 116b1 and the fourth meandering line 116b2 includes at least two line segments with different extending directions, for example, the meandering part 1167 may be of any shape such as a square wave, a sharp angle, a wave or a "bottle" shape. FIG. 6 takes a case where the meandering part 1167 is in the shape of a "bottle" as an example, but this does not limit the protection scope of the embodiments of the present disclosure.

With continued reference to FIG. 5, a connection line between the first end of the first connection bar 1165 of the first meandering line 116a1 and the second end of the second connection bar 1166 of the first meandering line 116a1 is a first line segment; a connection line between the first end of the first connection bar 1165 of the second meandering line 116a2 and the second end of the second connection bar 1166 of the second meandering line 116a2 is a second line segment; orthogonal projections of the meandering parts 1167 of the first meandering line 116a1 and the second meandering line 116a2 on the base substrate 01 are both located within an area defined by orthogonal projections of the first line segment and the second line segment on the base substrate 01. A connection line between the first end of the first connection bar 1165 of the third meandering line 116b1 and the second end of the second connection bar 1166 of the third meandering line 116b1 is a third line segment; a connection line between the first end of the first connection bar 1165 of the fourth meandering line 116b2 and the second end of the second connection bar 1166 of the fourth meandering line 116b2 is a fourth line segment; orthogonal projections of the meandering parts 1167 of the third meandering line 116b1 and the fourth meandering line 116b2 on the base substrate 01 are both located within an area defined by orthogonal projections of the third line segment and the fourth line segment on the base substrate 01. In this case, with the first connection part 114 formed by the first meandering line 116a1 and the second meandering line 116a2, and the second connection part 115 formed by the third meandering line 116b1 and the fourth meandering line 116b2, when a DC bias voltage is applied to the film bridge, electrostatic forces applied on the first connection part 114 and the second connection part 115 are balanced with each other, so as to ensure that the bridge deck structure 11 moves down towards the signal electrode 10 as parallelly as possible.

It should be noted that, in some exemplary embodiments, it is also possible that only the orthogonal projections of the meandering parts 1167 of the first meandering line 116a1 and the second meandering line 116a2 on the base substrate 01 are both located within the area defined by the orthogonal projections of the first line segment and the second line segment on the base substrate 01. Alternatively, only the orthogonal projections of the meandering parts 1167 of the third meandering line 116b1 and the fourth meandering line 116b2 on the base substrate 01 are both located within the area defined by the orthogonal projections of the third line segment and the fourth line segment on the base substrate 01. In this regard, the embodiments of the present disclosure will not list the cases one by one for description.

Figure 7:
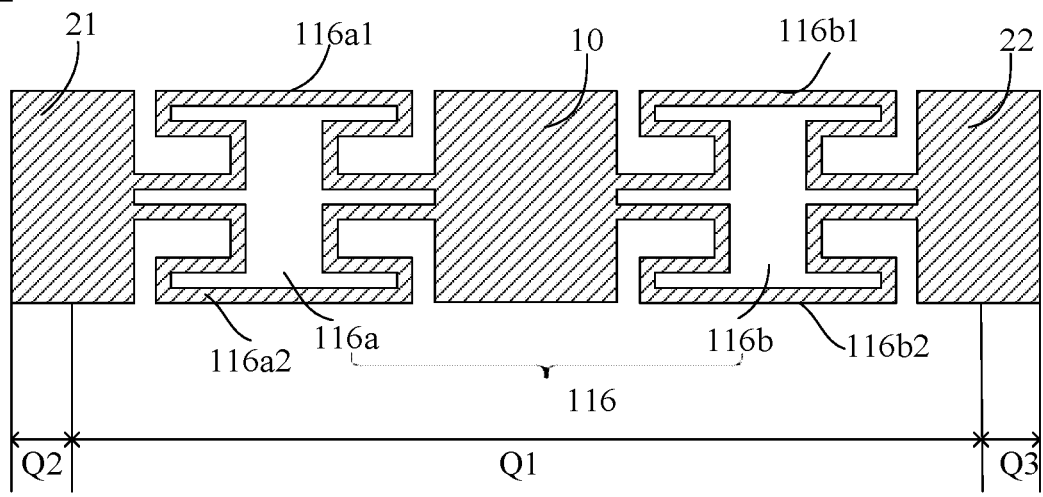
FIG. 7 is a top view of a film bridge of another phase shifter according to an embodiment of the present disclosure.

In some exemplary embodiments, FIG. 7 is a top view of a film bridge of another phase shifter according to an embodiment of the present disclosure. As shown in FIG. 7, a structure of the phase shifter is roughly the same as the structure shown in FIG. 5, except that the orthogonal projections of the meandering parts 1167 of the first meandering line 116a1 and the second meandering line 116a2 on the base substrate 01 are both located outside the area defined by the orthogonal projections of the first line segment and the second line segment on the base substrate 01, and that the orthogonal projections of the meandering parts 1167 of the third meandering line 116b1 and the fourth meandering line 116b2 on the base substrate 01 are both located outside the area defined by the orthogonal projections of the third line segment and the fourth line segment on the base substrate 01. In this case, with the first connection part 114 formed by the first meandering line 116a1 and the second meandering line 116a2, and the second connection part 115 formed by the third meandering line 116b1 and the fourth meandering line 116b2, when a DC bias voltage is applied to the film bridge, the electrostatic forces applied on the first connection part 114 and the second connection part 115 are balanced with each other, so as to ensure that the bridge deck structure 11 moves down towards the signal electrode 10 as parallelly as possible.

It should be noted that, in some exemplary embodiments, it is also possible that only the orthogonal projections of the meandering parts 1167 of the first meandering line 116a1 and the second meandering line 116a2 on the base substrate 01 are both located outside the area defined by the orthogonal projections of the first line segment and the second line segment on the base substrate 01. Alternatively, only the orthogonal projections of the meandering parts 1167 of the third meandering line 116b1 and the fourth meandering line 116b2 on the base substrate 01 are both located outside the area defined by the orthogonal projections of the third line segment and the fourth line segment on the base substrate 01. In this regard, the embodiments of the present disclosure will not list the cases one by one for description.

Figure 8:
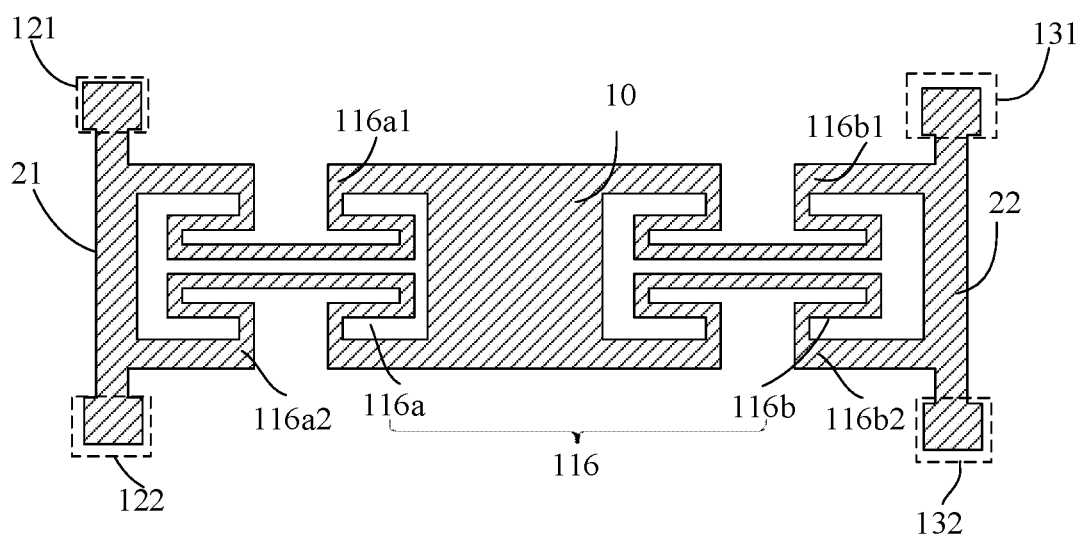
FIG. 8 is a top view of a film bridge of another phase shifter according to an embodiment of the present disclosure.

As a third exemplary embodiment, FIG. 8 is a top view of a film bridge of another phase shifter according to an embodiment of the present disclosure. As shown in FIG. 8, a structure of the phase shifter is roughly the same as the structure shown in FIG. 5, and differs only in structures of the first connection arm 12 and the second connection arm 13. As shown in FIG. 8, the first connection arm 12 of the phase shifter includes a first connection sub-arm 121 and a second connection sub-arm 122; the second connection arm 13 includes a third connection sub-arm 131 and a fourth connection sub-arm 132. Each of the second functional part 112 and the third functional part 113 includes a first end and a second end opposite to each other in the length direction of the signal electrode 10. The first connection sub-arm 121 is connected to the first end of the second functional part 112, and the second connection sub-arm 122 is connected to the second end of the second functional part 112; the third connection sub-arm 131 is connected to the first end of the third functional part 113, and the fourth connection sub-arm 132 is connected to the second end of the third functional part 113. In this case, the phase shifter fixes the bridge deck structure 11 through the first connection sub-arm 121, the second connection sub-arm 122, the third connection sub-arm 131 and the fourth connection sub-arm 132, that is, the bridge deck structure 11 is fixed by a four-point fixing method, so that a driving voltage of the phase shifter can be reduced, stability of the phase shifter can be improved and power consumption of the phase shifter can be reduced.

Figure 9:
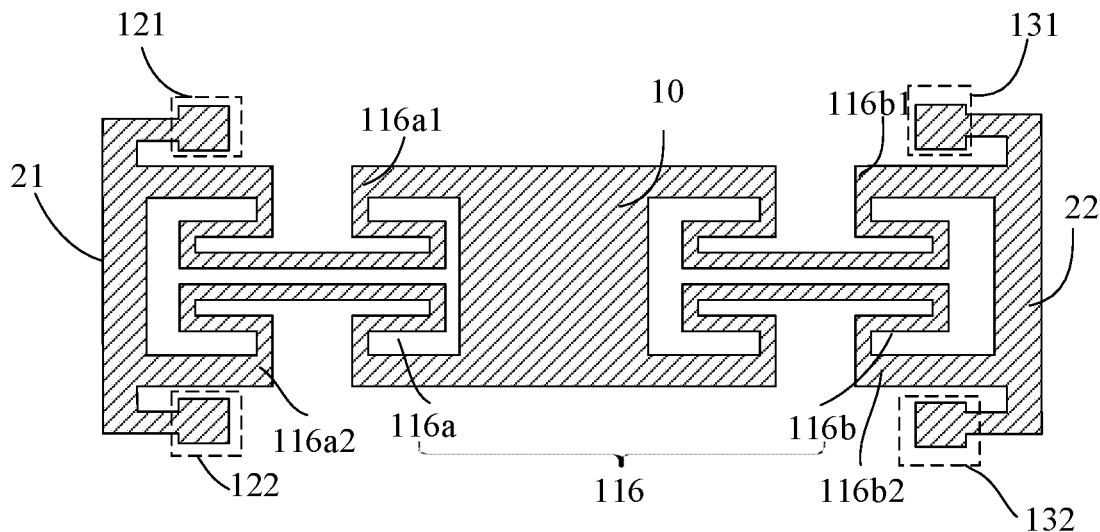
FIG. 9 shows a structure of a film bridge of another phase shifter according to an embodiment of the present disclosure.

Similarly, FIG. 9 shows a structure of a film bridge of another phase shifter according to an embodiment of the present disclosure. As shown in FIG. 9, the bridge deck structure 11 of this phase shifter is the same as the bridge deck structure 11 shown in FIG. 8, and the first connection arm 12 and the second connection arm 13 have structures similar to those shown in FIG. 8, that is, the bridge deck structure 11 is fixed by the four-point fixing method. However, a connection line between a center of the first connection sub-arm 121 and a center of the second connection sub-arm 122 is parallel to, but not on the same straight line as, an extending direction of the second functional part 112. Similarly, a connection line between a center of the third connection sub-arm 131 and a center of the fourth connection sub-arm 132 is parallel to, but not on the same straight line as, an extending direction of the third functional part 113. In this way, the driving voltage of the phase shifter can be reduced, the stability of the phase shifter can be improved and the power consumption of the phase shifter can be reduced. The detailed structure of the phase shifter is substantially the same as the structure shown in FIG. 8, and thus will not be repeated here.

Figure 10:
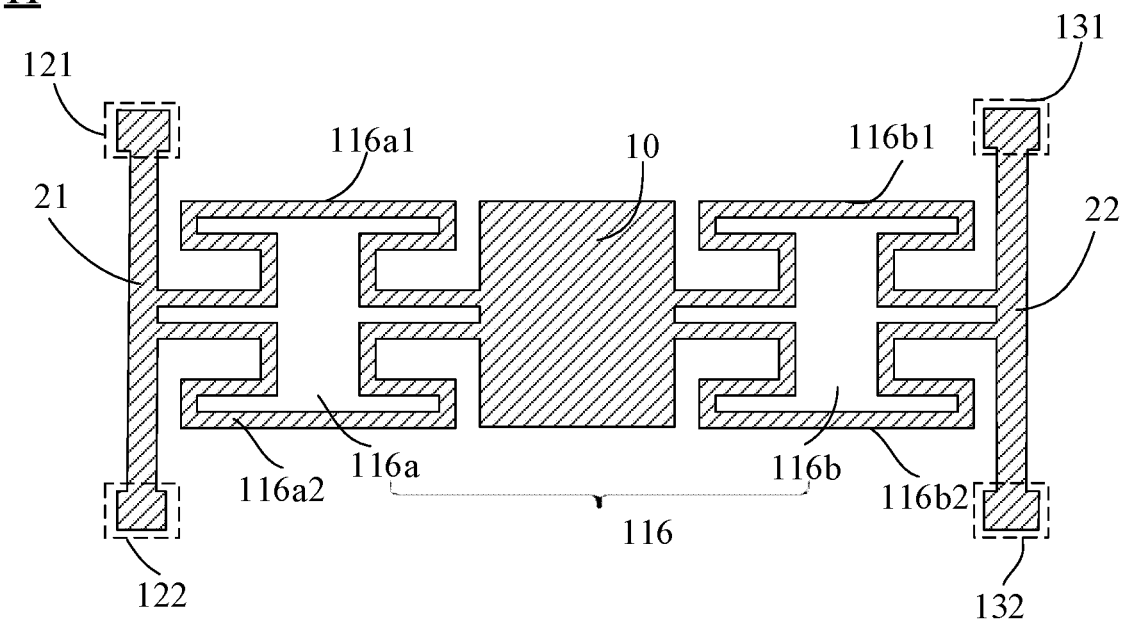
FIG. 10 shows a structure of a film bridge of another phase shifter according to an embodiment of the present disclosure.

Similarly, FIG. 10 shows a structure of a film bridge of another phase shifter according to an embodiment of the present disclosure. As shown in FIG. 10, the bridge deck structure 11 of this phase shifter is the same as the bridge deck structure 11 shown in FIG. 7, and the first connection arm 12 and the second connection arm 13 have the same structures as those shown in FIG. 8, that is, the bridge deck structure 11 is also fixed by the four-point fixing method, which can reduce the driving voltage of the phase shifter, improve the stability of the phase shifter and reduce the power consumption of the phase shifter. The detailed structure of the phase shifter is substantially the same as the structure shown in FIG. 7, and thus will not be repeated here.

Figure 11:
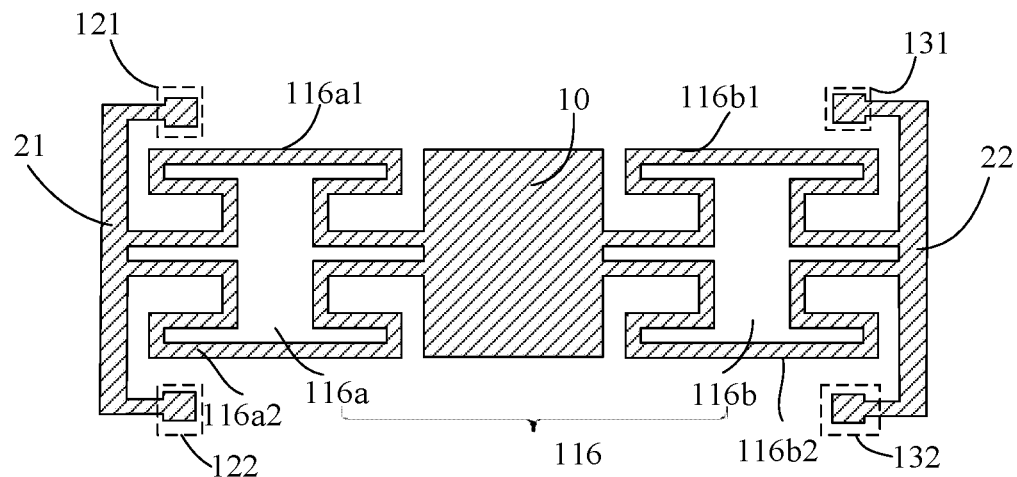
FIG. 11 is a top view of a film bridge of another phase shifter according to an embodiment of the present disclosure.

Similarly, FIG. 11 is a top view of a film bridge of another phase shifter according to an embodiment of the present disclosure. As shown in FIG. 11, the bridge deck structure 11 of this phase shifter is the same as the bridge deck structure 11 shown in FIG. 10, the first connection arm 12 and the second connection arm 13 have the same structures as those shown in FIG. 9, that is, the bridge deck structure 11 is also fixed by the four-point fixing method. In this way, the driving voltage of the phase shifter can be reduced, the stability of the phase shifter can be improved and the power consumption of the phase shifter can be reduced. The detailed structure of the phase shifter is substantially the same as the structure shown in FIG. 10, and thus will not be repeated here.

Figure 12:
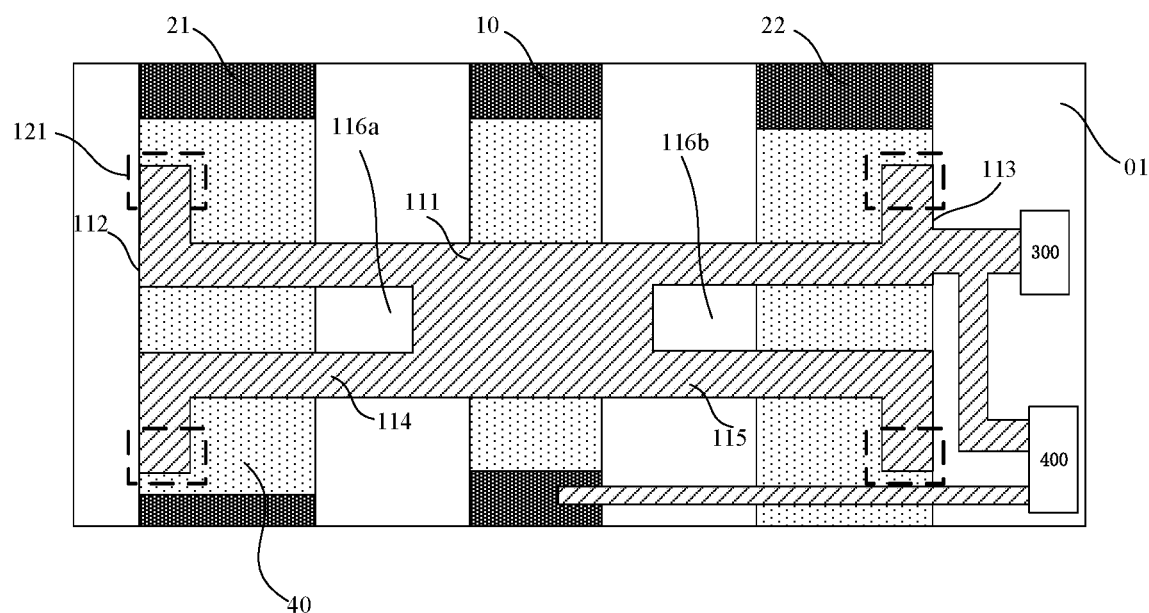
FIG. 12 is a top view of another phase shifter according to an embodiment of the present disclosure.

As a fourth exemplary embodiment, FIG. 12 is a top view of another phase shifter according to an embodiment of the present disclosure. As shown in FIG. 12, the first connection arm 12 and the second connection arm 13 of the phase shifter have the same structures as those shown in FIG. 8, that is, the bridge deck structure 11 is also fixed by the four-point fixing method, and the difference therebetween is that the hollow pattern 116 in this phase shifter includes a first hollow sub-pattern 116a and a second hollow sub-pattern 116b. The first hollow sub-pattern 116a penetrates through parts of the structures of the second functional part 112 and the first connection part 114; the second hollow sub-pattern 116b penetrates through parts of the structures of the third functional part 113 and the second connection part 115. That is, openings are formed in the second functional part 112 and the first connection parts 114, and openings are formed in the third functional parts 113 and the second connection parts 115. In this way, the driving voltage of the phase shifter can be reduced, the stability of the phase shifter can be improved and the power consumption of the phase shifter can be reduced. The detailed structure of the phase shifter is substantially the same as the structure shown in FIG. 8, and thus will not be repeated here.

It should be noted that, in the phase shifter shown in FIG. 12, the film bridge will be picked up (or pulled in) instantly after the driving voltage is applied, no oscillation occurs, and stability is achieved after about 0.4 μs. This shows that the phase shifter having this structure has a response time of 0.4 μs, which is about ten times faster than a response speed of a traditional phase shifter, and the effect is very significant.

Figure 13:
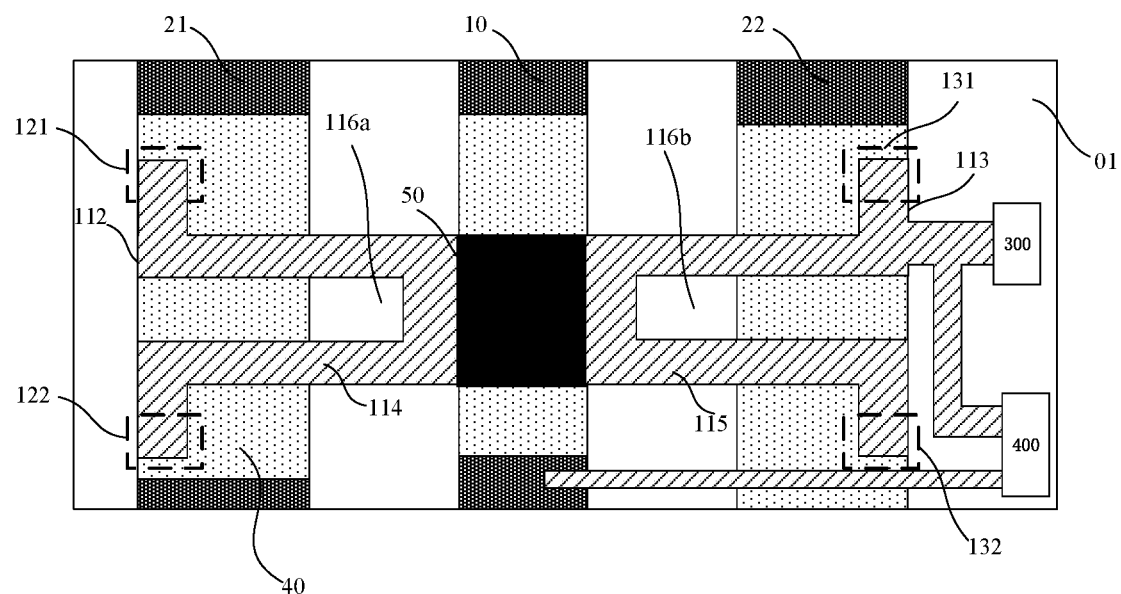
FIG. 13 is a top view of another phase shifter according to an embodiment of the present disclosure.

As a fifth exemplary embodiment, FIG. 13 is a top view of another phase shifter according to an embodiment of the present disclosure. As shown in FIG. 13, a structure of the film bridge is substantially the same as that of the film bridge shown in FIG. 12, and differs only in that a mass loading structure 50 is added. The mass loading structure 50 is located on a side of the first functional part 111 away from the signal electrode 10. By providing the mass loading structure 50, deformation is ensured to be minimized when a voltage is applied to the film bridge, so as to improve transient response and stability of the film bridge. It should be noted that, the mass loading structure 50 may be added to any one of the phase shifters shown in FIGS. 3 to 12, which will not be described one by one here.

It should be noted that, for the phase shifter shown in FIG. 13, the film bridge will be picked up instantly after the driving voltage is applied thereto, no oscillation occurs, and stability is achieved after about 0.4 µs. This shows that the phase shifter having this structure has a response time of 0.4 µs. In addition, by adding the mass loading structure 50, the film bridge has a larger pick-up area, and the film bridge is more stable, which ensures better operating stability of the entire device at an initial stage of loading the driving voltage.

Figure 14:
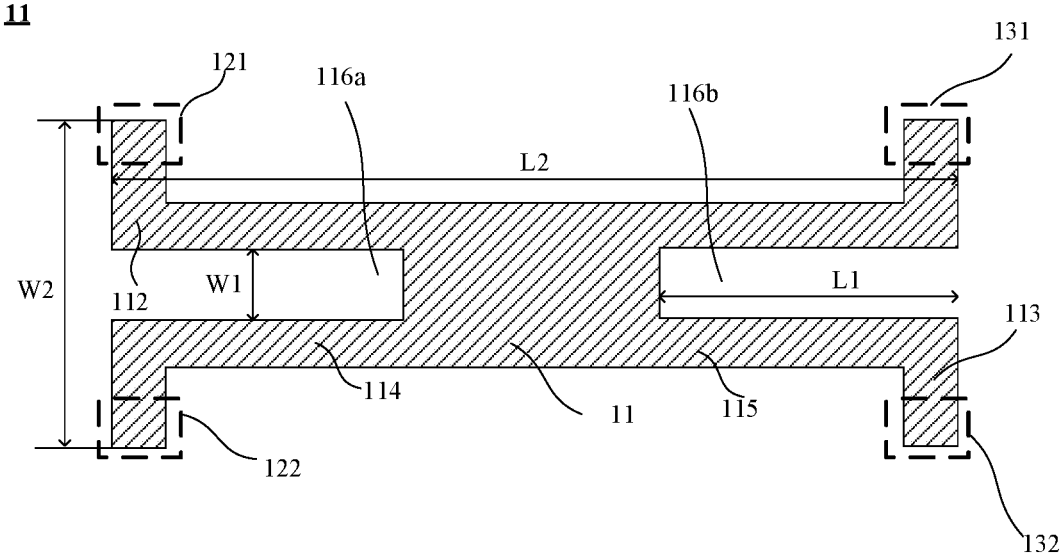
FIG. 14 is a top view of a film bridge of a phase shifter according to an embodiment of the present disclosure.

In some exemplary embodiments, FIG. 14 is a top view of a film bridge of a phase shifter according to an embodiment of the present disclosure. As shown in FIG. 14, a width and a depth of each of the first hollow sub-pattern 116 and the second hollow sub-pattern 116 *b* are W1 and L1, respectively. The maximum width and the maximum length of the bridge deck structure 11 are W2 and L2, respectively. To reduce instability of the device while ensuring the response speed thereof, there are certain requirements on a ratio of W1 to W2 and a ratio of L1 to L2. For example, 0.2<L1/L2<0.4, and 0.1<W1/W2<0.3.

Figure 15:
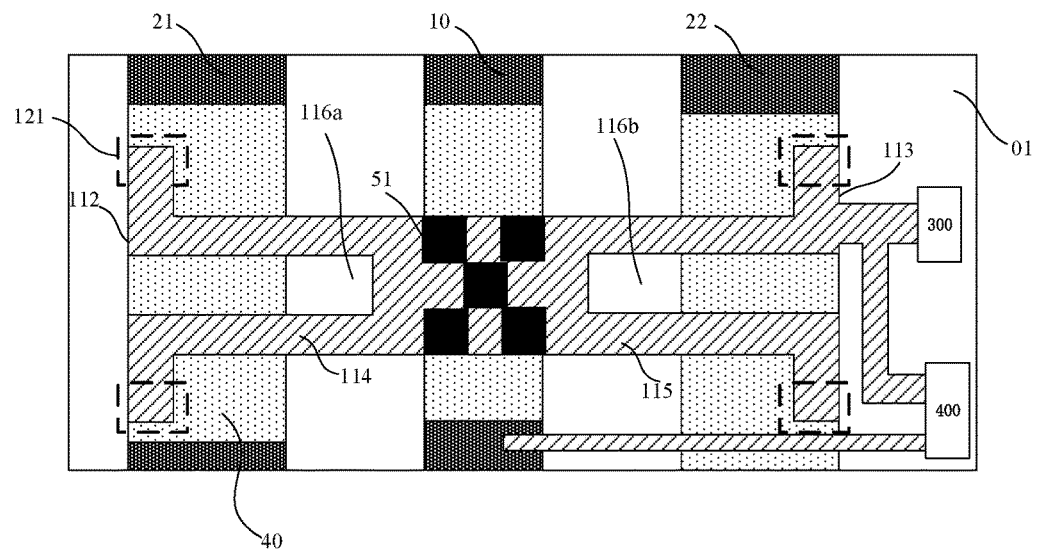
FIG. 15 is a top view of another phase shifter according to an embodiment of the present disclosure.

In some exemplary embodiments, FIG. 15 is a top view of another phase shifter according to an embodiment of the present disclosure. As shown in FIG. 15, the mass loading structure 50 may include a plurality of mass loading sub-blocks 51. For example, the plurality of mass loading sub-blocks 51 are evenly distributed on the first functional part 111. FIG. 15 shows a case where the mass loading structure 50 includes five mass loading sub-blocks 51 as an example, and the five mass loading sub-blocks 51 are respectively provided at four corners and the center of the first functional part 111.

Figure 16:
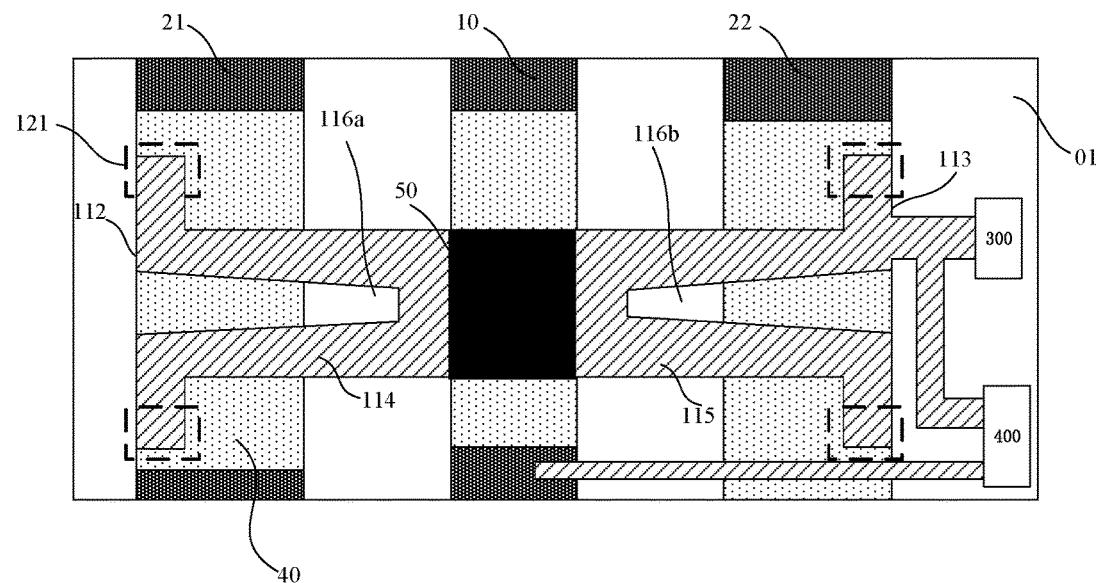
FIG. 16 is a top view of another phase shifter according to an embodiment of the present disclosure.

In some exemplary embodiments, FIG. 16 is a top view of another phase shifter according to an embodiment of the present disclosure. As shown in FIG. 16, a structure of this phase shifter is roughly the same as that of the phase shifter shown in FIG. 13, and differs only in that shapes of the first hollow sub-pattern 116*a* and the second hollow sub-pattern 116*b* shown in FIG. 16 are different from those shown in FIG. 13. The first hollow sub-pattern 116*a* and the second hollow sub-pattern 116*b* of the phase shifter in FIG. 16 are trapezoidal openings, while the other structures of the phase shifter in FIG. 16 are the same as those shown in FIG. 13 and thus will not be repeated here. Of course, FIG. 16 only shows an exemplary shape of the first hollow sub-pattern 116*a* and the second hollow sub-pattern 116*b*, and in actual products, the shapes of the first hollow sub-pattern 116*a* and the second hollow sub-pattern 116*b* are not limited thereto, which is not listed one by one here.

In a second aspect, an embodiment of the present disclosure provides an antenna including any one of the above phase shifters.

Since the antenna in the embodiment of the present disclosure includes the above phase shifter, and the film bridge of the phase shifter is provided with the hollow pattern 116 in the functional area Q1, which is equivalent to reducing the width of the part of the film bridge located in the functional area Q1, when a DC bias voltage is applied to the film bridge, the functional area Q1 of the film bridge can be moved down towards the signal electrode 10 as parallelly as possible, so as to ensure the phase shifting accuracy of the phase shifter, thereby improving performance of the antenna.

It should be understood that the above embodiments are merely exemplary embodiments that are employed to illustrate the principles of the present disclosure, and the present disclosure is not limited thereto. Various modifications and improvements may be made by those skilled in the art without departing from the spirit and essence of the present disclosure, and should be considered to fall within the protection scope of the present disclosure.

What is claimed is:

1. A phase shifter, comprising:
a base substrate,
a signal electrode, a first reference electrode, and a second reference electrode all on the base substrate, and the first reference electrode and the second reference electrode being respectively on two sides of a length direction of the signal electrode;
an interlayer insulating layer on a side of the signal electrode away from the base substrate; and
at least one phase control unit each comprising a film bridge on a side of the interlayer insulating layer away from the base substrate; at least part of the signal electrode being in space enclosed by the base substrate and the film bridge, and orthogonal projections of two ends of the film bridge on the base substrate respectively overlapping with orthogonal projections of the first reference electrode and the second reference electrode on the base substrate; wherein
the film bridge comprises a first anchor point area, a second anchor point area, and a functional area between the first anchor point area and the second anchor point area; and the film bridge has a hollow pattern in the functional area.

2. The phase shifter of claim 1, wherein the hollow pattern is axially symmetric with respect to an extending direction running through a perpendicular bisector of a width of the signal electrode.

3. The phase shifter of claim 1, wherein at least some of the at least one phase control unit have different numbers of film bridges.

4. An antenna, comprising the phase shifter of claim 1.

5. The phase shifter of claim 1, wherein the film bridge comprises a bridge deck structure, a first connection arm, and a second connection arm; the first connection arm is in the first anchor point area; the second connection arm is in the second anchor point area; the bridge deck structure comprises a first functional part, a second functional part, a third functional part, a first connection part, and a second connection part; the first functional part and the second functional part are connected to each other by the first connection part; the first functional part and the third functional part are connected to each other by the second connection part; the second functional part is further connected with the first connection arm; the third functional part is further connected with the second connection arm; an orthogonal projection of the first functional part on the base substrate is located within an orthogonal projection of the signal electrode on the base substrate; an orthogonal projection of the second functional part on the base substrate is located within an orthogonal projection of the first reference electrode on the base substrate; an orthogonal projection of the third functional part on the base substrate is located within an orthogonal projection of the second reference electrode on the base substrate; and
the hollow pattern is at least in the first functional part.

6. The phase shifter of claim 5, further comprising a mass loading structure on a side of the first functional part away from the signal electrode.

7. The phase shifter of claim 5, wherein the hollow pattern at least comprises a first groove and a second groove that are in the first functional part, and the first groove and the second groove are respectively on two sides of the first functional part in a length direction of the first functional part, and penetrate through the first functional part in a thickness direction of the first functional part; and each of the first connection part and the second connection part comprises a first end and a second end opposite to each other; the second end of the first connection part is connected to a bottom of the first groove, and the second end of the second connection part is connected to a bottom of the second groove.

8. The phase shifter of claim 7, wherein the hollow pattern further comprises a third groove and a fourth groove; the third groove is on a side of the second functional part proximal to the first functional part, and penetrates through the second functional part in a thickness direction of the second functional part; and the fourth groove is on a side of the third functional part proximal to the first functional part, and penetrates through the third functional part in a thickness direction of the third functional part; and the first end of the first connection part is connected to a bottom of the third groove, and the first end of the second connection part is connected to a bottom of the fourth groove.

9. The phase shifter of claim 1, further comprising a first switch unit on the base substrate, wherein the first switch unit is configured to provide a bias voltage signal to the film bridge upon receipt of a first control signal.

10. The phase shifter of claim 9, wherein the first switch unit comprises a first switch transistor, a first electrode of the first switch transistor serves as a bias voltage input terminal of the first switch unit, a second electrode of the first switch transistor serves as a first output terminal of the first switch unit, a control electrode of the first switch transistor serves as a first control terminal of the first switch unit, and the first switch transistor is capable of electrically connecting the first electrode and the second electrode to each other upon receipt of the first control signal at the control electrode.

11. The phase shifter of claim 9, further comprising a second switch unit on the base substrate, wherein the second switch unit is configured to electrically connect the signal electrode and the film bridge to each other upon receipt of a second control signal; or wherein the first switch unit is further configured to electrically connect the signal electrode and the film bridge to each other upon receipt of a second control signal.

12. The phase shifter of claim 1, wherein the film bridge comprises a bridge deck structure, a first connection arm, and a second connection arm; the first connection arm is in the first anchor point area; the second connection arm is in the second anchor point area; the bridge deck structure comprises a first functional part, a second functional part, a third functional part, a first connection part, and a second connection part; the first functional part and the second functional part are connected to each other by the first connection part; the first functional part and the third functional part are connected to each other by the second connection part; the second functional part is further connected with the first connection arm; the third functional part is further connected with the second connection arm; an orthogonal projection of the first functional part on the base substrate is located within an orthogonal projection of the signal electrode on the base substrate; an orthogonal projection of the second functional part on the base substrate is located within an orthogonal projection of the first reference electrode on the base substrate; an orthogonal projection of the third functional part on the base substrate is located within an orthogonal projection of the second reference electrode on the base substrate; and the hollow pattern is at least in the first connection part and/or the second connection part.

13. The phase shifter of claim 12, wherein the hollow pattern comprises a first hollow sub-pattern and a second hollow sub-pattern;

the first connection part comprises a first meandering line and a second meandering line spaced apart from each other along the length direction of the signal electrode; the second connection part comprises a third meandering line and a fourth meandering line spaced apart from each other along the length direction of the signal electrode;

the first meandering line and the second meandering line are both connected between the first functional part and the second functional part, and define the first hollow sub-pattern; and the third meandering line and the fourth meandering line are both connected between the first functional part and the third functional part, and define the second hollow sub-pattern.

14. The phase shifter of claim 13, wherein the first meandering line and the second meandering line are in mirror symmetry with respect to an axis of symmetry perpendicular to the length direction of the signal electrode; and the third meandering line and the fourth meandering line are in mirror symmetry with respect to an axis of symmetry perpendicular to the length direction of the signal electrode.

15. The phase shifter of claim 13, wherein each of the first meandering line, the second meandering line, the third meandering line, and the fourth meandering line comprises a first connection bar, a second connection bar, and a meandering part; each of the first connection bar, the second connection bar, and the meandering part comprises a first end and a second end;

for each of the first meandering line, the second meandering line, the third meandering line, and the fourth meandering line, the second end of the first connection bar is connected to the first end of the meandering part, and the second end of the meandering part is connected to the first end of the second connection bar;

for each of the first meandering line and the second meandering line, the first end of the first connection bar is connected to the second functional part, and the second end of the second connection bar is connected to the first functional part;

for each of the third meandering line and the fourth meandering line, the first end of the first connection bar is connected to the third functional part, and the second end of the second connection bar is connected to the first functional part;

a connection line between the first end of the first connection bar of the first meandering line and the second end of the second connection bar of the first meandering line is a first line segment; a connection line between the first end of the first connection bar of the second meandering line and the second end of the second connection bar of the second meandering line is a second line segment; and orthogonal projections of the meandering parts of the first meandering line and the second meandering line on the base substrate are both located within an area defined by orthogonal projections of the first line segment and the second line segment on the base substrate; and/or, a connection line between the first end of the first connection bar of the third meandering line and the second end of the second connection bar of the third meandering line is a third line segment; a connection line between the first end of the first connection bar of the fourth meandering line and the second end of the second connection bar of the fourth meandering line is a fourth line segment; and orthogonal projections of the meandering parts of the third meandering line and the fourth meandering line on the base substrate are both located within an area defined by orthogonal projections of the third line segment and the fourth line segment on the base substrate.

16. The phase shifter of claim 13, wherein each of the first meandering line, the second meandering line, the third meandering line, and the fourth meandering line comprises a first connection bar, a second connection bar, and a meandering part; each of the first connection bar, the second connection bar, and the meandering part comprises a first end and a second end;

for each of the first meandering line, the second meandering line, the third meandering line, and the fourth meandering line, the second end of the first connection bar is connected to the first end of the meandering part, and the second end of the meandering part is connected to the first end of the second connection bar;

for each of the first meandering line and the second meandering line, the first end of the first connection bar is connected to the second functional part, and the second end of the second connection bar is connected to the first functional part;

for each of the third meandering line and the fourth meandering line, the first end of the first connection bar is connected to the third functional part, and the second end of the second connection bar is connected to the first functional part;

a connection line between the first end of the first connection bar of the first meandering line and the second end of the second connection bar of the first meandering line is a first line segment; a connection line between the first end of the first connection bar of the second meandering line and the second end of the second connection bar of the second meandering line is a second line segment; and orthogonal projections of the meandering parts of the first meandering line and the second meandering line on the base substrate are both located outside an area defined by orthogonal projections of the first line segment and the second line segment on the base substrate; and/or, a connection line between the first end of the first connection bar of the third meandering line and the second end of the second connection bar of the third meandering line is a third line segment; a connection line between the first end of the first connection bar of the fourth meandering line and the second end of the second connection bar of the fourth meandering line is a fourth line segment; and orthogonal projections of the meandering parts of the third meandering line and the fourth meandering line on the base substrate are both located outside an area defined by orthogonal projections of the third line segment and the fourth line segment on the base substrate.

17. The phase shifter of claim 12, wherein the first connection arm comprises a first connection sub-arm and a second connection sub-arm; the second connection arm comprises a third connection sub-arm and a fourth connection sub-arm; each of the second functional part and the third functional part comprises a first end and a second end opposite to each other along the length direction of the signal electrode;

the first connection sub-arm is connected to the first end of the second functional part, and the second connection sub-arm is connected to the second end of the second functional part; and the third connection sub-arm is connected to the first end of the third functional part, and the fourth connection sub-arm is connected to the second end of the third functional part.

18. The phase shifter of claim 17, wherein length directions of the second functional part and the third functional part are the same as the length direction of the signal electrode.

19. The phase shifter of claim 17, wherein each of the second functional part and the third functional part comprises a main body part, a first extension part and a second extension part; a length direction of the main body part is the same as the length direction of the signal electrode, the first extension part and the second extension part are respectively connected to two ends of the main body part opposite to each other in the length direction of the main body, and extend toward the signal electrode;

the first extension part of the second functional part is connected with the first connection sub-arm, and the second extension part of the second functional part is connected with the second connection sub-arm; and the first extension part of the third functional part is connected with the third connection sub-arm, and the second extension part of the third functional part is connected with the fourth connection sub-arm.

20. The phase shifter of claim 17, wherein the hollow pattern comprises a first hollow sub-pattern and a second hollow sub-pattern;

the first hollow sub-pattern penetrates through at least parts of structures of the second functional part and the first connection part in a direction perpendicular to the length direction of the signal electrode; and the second hollow sub-pattern penetrates through at least parts of structures of the third functional part and the second connection part in the direction perpendicular to the length direction of the signal electrode.

* * * * *